US012588287B2

(12) United States Patent
Morita et al.

(10) Patent No.: US 12,588,287 B2
(45) Date of Patent: Mar. 24, 2026

(54) CIRCUIT SUBSTRATE

(71) Applicant: Magnolia White Corporation, Tokyo (JP)

(72) Inventors: Tetsuo Morita, Tokyo (JP); Hiroyuki Kimura, Tokyo (JP); Makoto Shibusawa, Tokyo (JP); Hiroshi Tabatake, Tokyo (JP); Yasuhiro Ogawa, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 624 days.

(21) Appl. No.: 17/985,957

(22) Filed: Nov. 14, 2022

(65) Prior Publication Data

US 2023/0074191 A1 Mar. 9, 2023

Related U.S. Application Data

(63) Continuation of application No. 16/952,455, filed on Nov. 19, 2020, now Pat. No. 11,532,649, which is a
(Continued)

(30) Foreign Application Priority Data

Apr. 1, 2016 (JP) .................................. 2016-074019

(51) Int. Cl.
*H01L 27/12* (2006.01)
*G02F 1/1362* (2006.01)
(Continued)

(52) U.S. Cl.
CPC ......... *H10D 86/60* (2025.01); *G02F 1/13624* (2013.01); *H10D 30/6755* (2025.01); *H10D 86/423* (2025.01); *H10D 86/441* (2025.01);

*H10D 86/481* (2025.01); *H10D 86/80* (2025.01); *G02F 1/136286* (2013.01); *G02F 1/1368* (2013.01); *H10D 30/6731* (2025.01); *H10D 30/6745* (2025.01); *H10K 59/1201* (2023.02); *H10K 59/1213* (2023.02); *H10K 59/1216* (2023.02)

(58) Field of Classification Search
CPC ...... H10D 86/60; H10D 86/441; H10D 86/80; H10D 30/6755; H10D 86/481; H10D 86/423; H10D 30/6731; H10D 30/6745; G02F 1/13624; H10K 59/1201; H10K 59/1213; H10K 59/1216
See application file for complete search history.

(56) References Cited

U.S. PATENT DOCUMENTS 10,319,752 B2 * 6/2019 Kao et al. ............ H10D 86/471

* cited by examiner

*Primary Examiner* — Victor A Mandala
*Assistant Examiner* — Colleen E Snow
(74) *Attorney, Agent, or Firm* — Michael Best & Friedrich LLP

(57) ABSTRACT

Provided is a display device including: a capacitor having a first electrode, a first insulating film over the first electrode, and a second electrode over the first insulating film; and a first transistor over the capacitor. The first transistor includes the second electrode, a second insulating film over the second electrode, an oxide semiconductor film over the second insulating film, and a first source electrode and a first drain electrode over the oxide semiconductor film. The first source electrode and the first drain electrode are electrically connected to the oxide semiconductor film.

4 Claims, 17 Drawing Sheets

300

Related U.S. Application Data continuation of application No. 16/234,838, filed on
Dec. 28, 2018, now Pat. No. 10,872,911, which is a
continuation of application No. 15/462,971, filed on
Mar. 20, 2017, now Pat. No. 10,204,937.

(51) Int. Cl.
| | | |
|---|---|---|
| *H10D 30/67* | (2025.01) | |
| *H10D 86/40* | (2025.01) | |
| *H10D 86/60* | (2025.01) | |
| *H10D 86/80* | (2025.01) | |
| *G02F 1/1368* | (2006.01) | |
| *H10K 59/12* | (2023.01) | |
| *H10K 59/121* | (2023.01) | |

CIRCUIT SUBSTRATE

CROSS REFERENCE TO RELATED APPLICATIONS

This application is a continuation of U.S. patent application Ser. No. 16/952,455, filed on Nov. 19, 2020, which, in turn, is a continuation of U.S. patent application Ser. No. 16/234,838 (now U.S. Pat. No. 10,872,911), filed on Dec. 28, 2018, which, in turn, is a continuation of U.S. patent application Ser. No. 15/462,971 (now U.S. Pat. No. 10,204, 937), filed on Mar. 20, 2017. Further, this application is based on and claims the benefit of priority from the prior Japanese Patent Application No. 2016-074019, filed on Apr. 1, 2016, the entire contents of which are incorporated herein by reference.

FIELD

An embodiment of the present invention relates to a display device, for example, a display device such as an organic EL display device and a manufacturing method thereof.

BACKGROUND

As a typical example exhibiting semiconductor properties, Group 14 elements such as silicon and germanium are represented. Particularly, silicon has been utilized in almost all of the semiconductor devices and recognized as a material supporting the basis of the electronics industry because of its wide availability, ease of processing, excellent semiconductor properties, and ease of controlling properties.

Recent finding of semiconductor properties in oxides, in particular oxides of Group 13 elements such as indium and gallium, has motivated intensive research and development. As a typical example of oxides exhibiting semiconductor properties (hereinafter, referred to as an oxide semiconductor), indium-gallium oxide (IGO), indium-gallium-zinc oxide (IGZO), and the like have been known. Intensive research in recent years has realized commercialization of display devices having transistors including these oxide semiconductors as a semiconductor element. Additionally, as exemplarily disclosed in Japanese patent application publication No. 2015-225104, international publication No. 2015-031037, and United States patent application publication 2010/0182223, a semiconductor device in which both a transistor having a silicon-including semiconductor (hereinafter, referred to as a silicon semiconductor) and a transistor having an oxide semiconductor are incorporated has been developed.

SUMMARY

An embodiment of the present invention is a display device including: a capacitor having a first electrode, a first insulating film over the first electrode, and a second electrode over the first insulating film; and a first transistor over the capacitor. The first transistor includes the second electrode, a second insulating film over the second electrode, an oxide semiconductor film over the second insulating film, and a first source electrode and a first drain electrode over the oxide semiconductor film. The first source electrode and the first drain electrode are electrically connected to the oxide semiconductor film.

An embodiment of the present invention is a display device including: a capacitor having a first electrode, a first insulating film over the first electrode, and a second electrode over the first insulating film; and a first transistor over the capacitor. The first transistor incudes the second electrode, a second insulating film over the second electrode, an oxide semiconductor film over the second insulating film, a third insulating film over the oxide semiconductor film, a third electrode over the third insulating film, and a first source electrode and a first drain electrode over the third electrode. The first source electrode and the first drain electrode are electrically connected to the oxide semiconductor film.

BRIEF DESCRIPTION OF DRAWINGS

FIG. 10 is a schematic cross-sectional view showing a manufacturing method of a display device of an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

In the present embodiment, structures of a semiconductor device according to an embodiment of the present invention and a display device including the semiconductor device are explained by using FIG. 1 to FIG. 5.

1. Outline Structure

Figure 1:
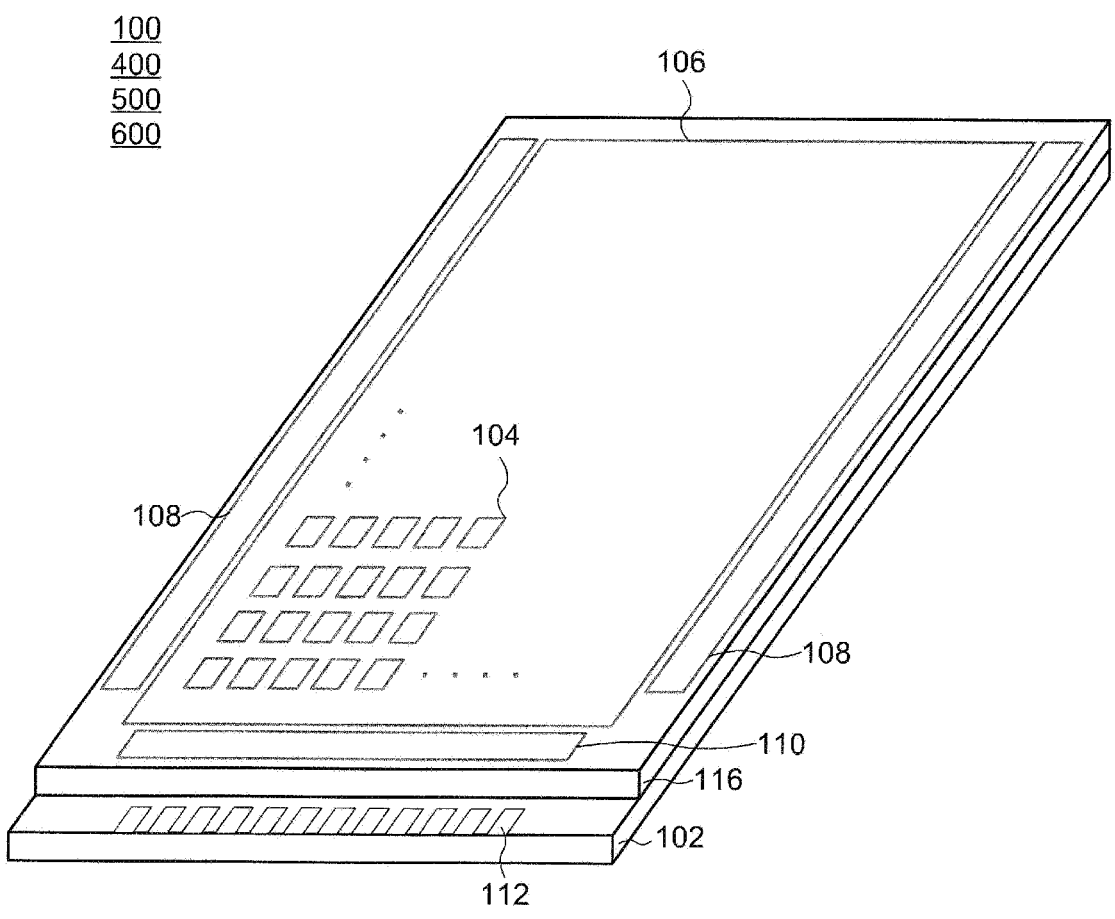
FIG. 1 is a perspective view of a display device of an embodiment of the present invention.

A perspective view schematically showing a display device 100 according to the present invention is illustrated in FIG. 1. The display device 100 has a display region 106 including a plurality of pixels 104 arranged in a row direction and column direction and gate-side driver circuits 108 over one surface (top surface) of a substrate 102. The display region 106 and the gate-side driver circuits 108 are provided between the substrate 102 and an opposing substrate 116.

Display elements such as a light-emitting element and a liquid crystal element giving colors different from one another can be disposed in the plurality of pixels 104, by which full-color display can be conducted. For example, display elements providing red, green, and blue colors may be arranged in three pixels 104, respectively. Alternatively, display elements exhibiting white color may be used in all pixels 104, and full-color display may be performed by using a color filter to extract red, green, or blue color from the respective pixels 104. The colors finally extracted are not limited to a combination of red, green, and blue colors. For instance, four kinds of colors of red, green, blue, and white may be respectively extracted from four pixels 104. The arrangement of the pixels 104 is also not limited, and a stripe arrangement, a delta arrangement, a Pentile arrangement, and the like can be employed.

Figure 2:
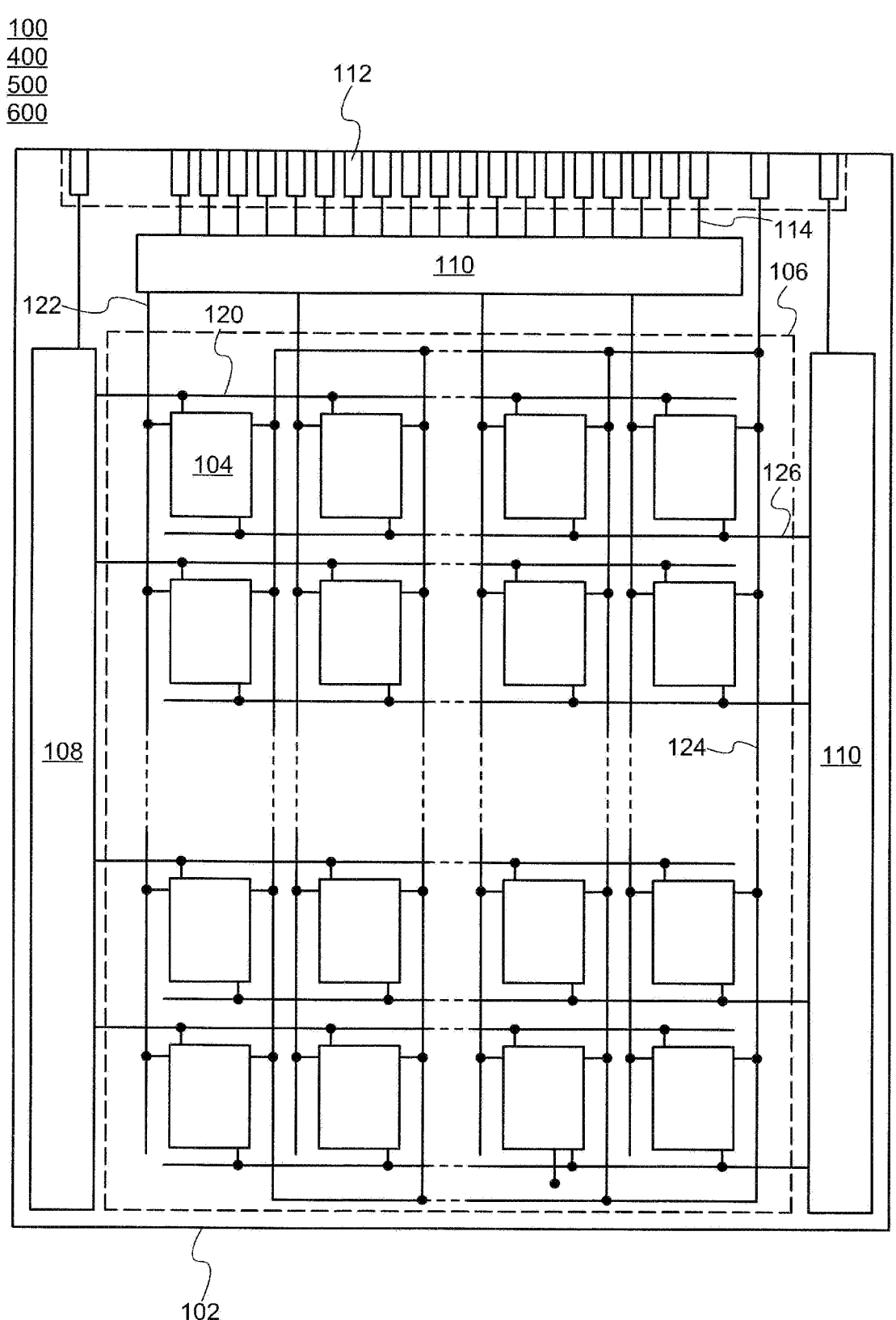
FIG. 2 is a schematic top view of a display device of an embodiment of the present invention.

As shown in FIG. 2, the display device 100 further possesses a source-side driver circuit 110. A variety of wirings exemplified by first scanning lines 120, second scanning lines 126, and image-signal lines 122 extends in a direction to the display region 106 from the gate-side driver circuits 108 and the source-side driver circuit 110 and is connected to the respective pixels 104. Wirings 114 extend to a side surface of the substrate 102 (short side of the substrate 102) from the source-side driver circuit 110 and are exposed at an end portion of the substrate 102 to form terminals 110. The terminals 110 are connected to a connector (not shown) such as a flexible printed circuit (FPC). Image signals supplied from an external circuit (not shown) are provided to the pixels 104 through the gate-side driver circuits 108 and the source-side driver circuit 110, and the display elements of the pixels 104 are controlled, by which images are displayed on the display region 106. In the present embodiment, two gate-side driver circuits 108 are arranged so as to sandwich the display region 106. However, just a single gate-side driver circuit 108 may be employed. Furthermore, the gate-side driver circuits 108 and the source-side driver circuit 110 may not be directly formed over the substrate 102, and a driver circuit fabricated over a different substrate may be mounted over the substrate 102 or the connector.

2. Pixel Circuit

Figure 3:
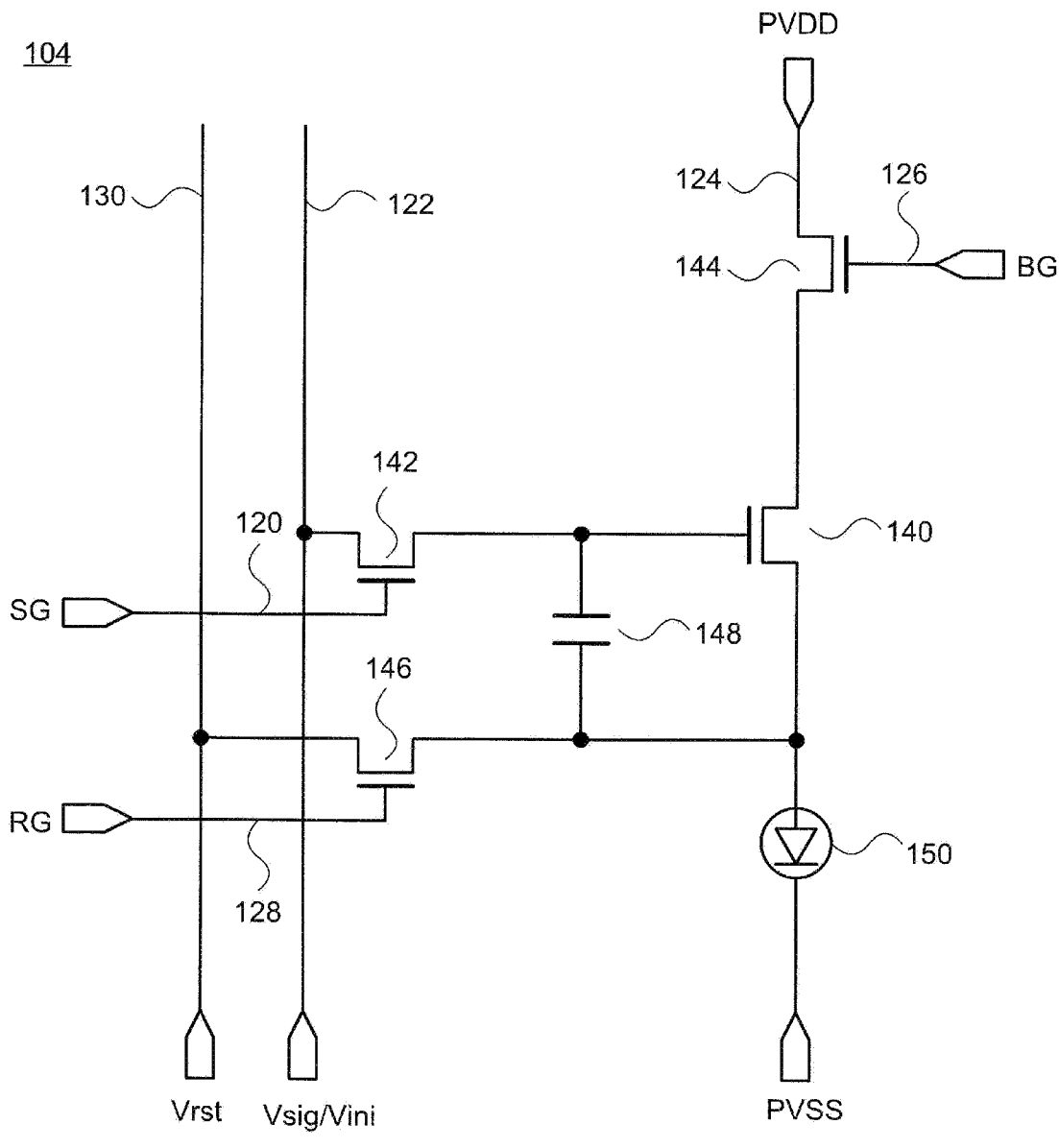
FIG. 3 is an equivalent circuit of a pixel of a display device of an embodiment of the present invention.

FIG. 3 shows an equivalent circuit of the pixel 104. The pixel 104 has a plurality of wirings and a plurality of semiconductor elements such as a transistor and a capacitor. Specifically, the first scanning line 120, the second scanning line 126, a third scanning line 128, the image-signal line 122, a reset power-source line 130, and a current-supplying line 124 are provided in the pixel 104. The first scanning line 120, the second scanning line 126, and the third scanning line 128 extend in the row direction from the gate-side driver circuit 108 through the plurality of pixels 104. On the other hand, the image signal line 122 and the reset power-source line 130 intersect with the first scanning line 120, the second scanning line 126, and the third scanning line 128 substantially perpendicularly and extend in the column direction through the plurality of pixels 104.

The pixel 104 possesses, as a semiconductor device, a first transistor 140, a second transistor 142, a third transistor 144, a fourth transistor 146, a capacitor (storage capacitor) 148, and the display element 150. Note that the equivalent circuit shown in FIG. 3 is just an example: the number of the transistors is not limited to four and may be two, three, five, or more, for example. Moreover, the number of the capacitors is not limited to one, and a plurality of capacitors may be included. The aforementioned combination of the wirings is also an example: another wiring may be disposed, and a part of the aforementioned wirings may be shared by the plurality of pixels 104.

The display element 150 is selected from a liquid crystal element and a light-emitting element. As a light-emitting element, a self-emission type element such as an organic electroluminescence (EL) element is represented. The display element 150 includes a pixel electrode, an opposing electrode, and a liquid crystal layer or an EL layer sandwiched therebetween.

The second scanning line 126 is connected to a gate electrode of the third transistor 144, and a control signal BG is input to the gate electrode of the third transistor 144. A source electrode of the third transistor 144 is connected to the current-supplying line 124 and applied with a high potential PVDD. A drain electrode of the third transistor 144 is connected to a drain electrode (first drain electrode) of the first transistor 140.

A gate electrode of the second transistor 142 is connected to the first scanning line 120 and applied with a control signal SG. A source electrode (second source electrode) of the second transistor 142 is connected to the image-signal line 122 and is input with an image signal Vsig or an initializing signal Vini. A drain electrode (second drain electrode) of the second transistor 142 is connected to a gate electrode of the first transistor 140 and one electrode (second electrode) of the capacitor 148.

A source electrode (first source electrode) of the first transistor 140 is connected the other electrode (first electrode) of the capacitor 148 and the pixel electrode (anode) of the display element 150.

A gate electrode of the fourth transistor 146 is connected to the third scanning line 128 and input with a control signal RG. A source electrode of the fourth transistor 146 is connected to the reset power-source line 130 and is applied with a reset potential Vrst. A drain electrode of the fourth transistor 146 is electrically connected to the other electrode (first electrode) of the capacitor 148 and the pixel electrode of the display element 150.

The opposing electrode (cathode) of the display element 150 is applied with a low potential PVSS.

During operation, the control signal RG is input to the gate electrode of the fourth transistor 146 turning the fourth transistor 146 to an on-state. With this operation, the reset potential Vrst is provided to the first electrode of the capacitor 148, the pixel electrode, and the source electrode of the first transistor 140 from the reset power-source line 130, by which a potential of the source electrode of the first transistor 140 is reset.

After that, the gate electrode of the second transistor 142 is applied with the control signal SG turning the second transistor 142 to an on-state. At this time, the image-signal line 122 is applied with the initializing signal Vini to allow the gate electrode of the first transistor 140 to have a potential corresponding to the initializing signal Vini, by which initialization is performed.

Next, the fourth transistor 146 is turned off, the gate electrode of the second transistor 142 is input with the control signal SG to turn on the second transistor 142, and the gate electrode of the third transistor 144 is input with the control signal BG to turn off the third transistor 144. With this process, an offset-canceling operation of a threshold of the first transistor 140 is performed. At this time, the image-signal line 122 is applied with the initializing signal Vini which is input to the gate electrode of the first transistor 140. A potential of the source electrode of the first transistor 140 is increased to a potential lower than the gate potential Vini by a threshold voltage. The potential difference at this time depends on the first transistor 140 included in each pixel 104.

After the offset-canceling operation is completed, the image-signal line 122 is input with the image signal Vsig, by which the image signal Vsig is written to the gate electrode of the first transistor 140.

After that, the second transistor 142 is turned off. A current supplied from the current-supplying line 124 flows to the display element 150 through the first transistor 140, by which a display operation is started, and display is maintained until the third transistor 144 is turned off by the control signal BG.

Note that the source electrode and the drain electrode of each transistor may be interchanged depending on a direction of current flowing through the semiconductor film and a polarity of the transistor. Therefore, the aforementioned relationship between the source electrode and the drain electrode is simply for the sake of convenience.

3. Pixel Structure

Figure 4:
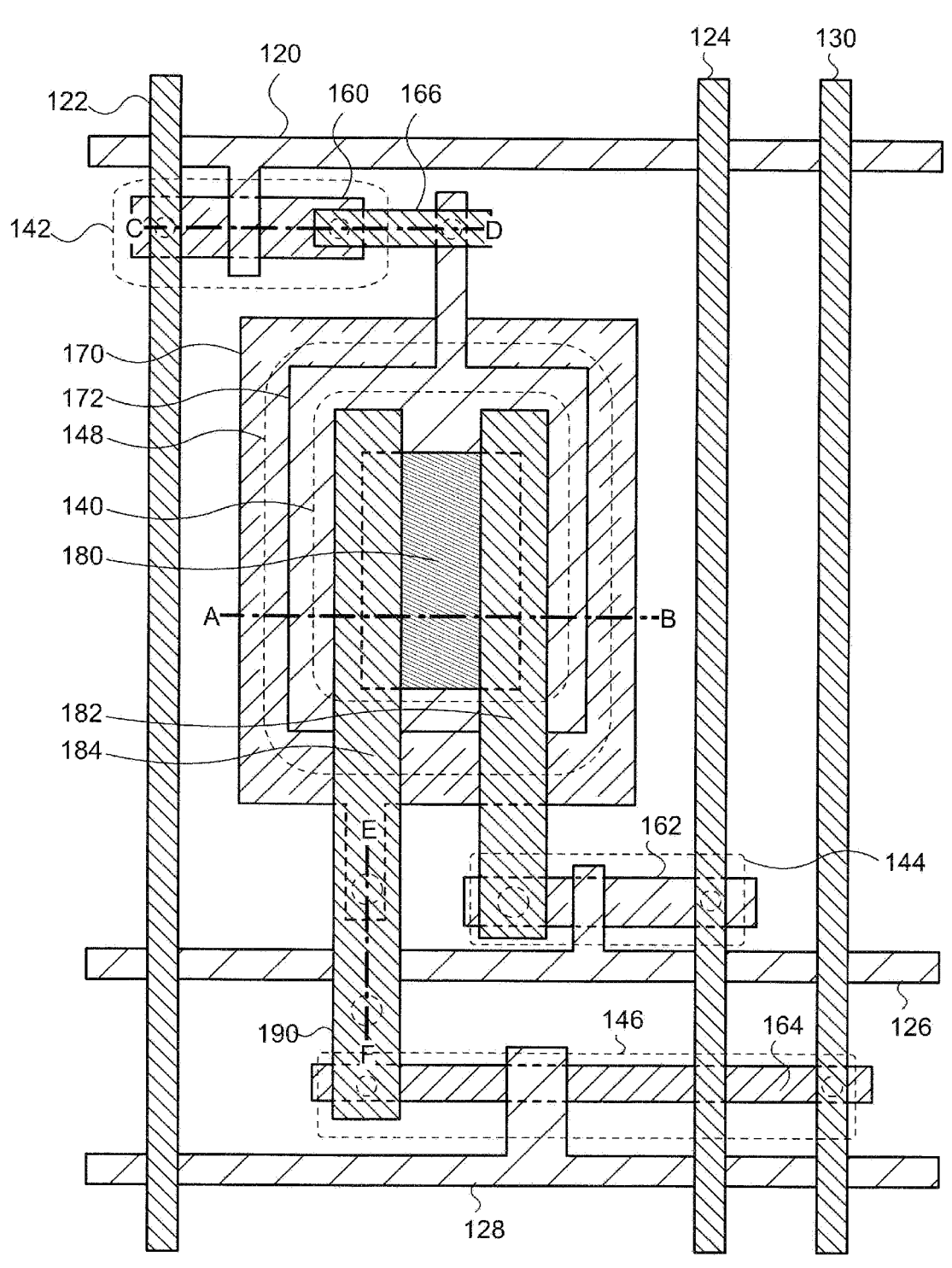
FIG. 4 is a schematic top view of a pixel of a display device of an embodiment of the present invention.

A schematic top view of the pixel 104 is shown in FIG. 4. The display element 150 is not illustrated in FIG. 4. The second transistor 142 includes a semiconductor film 160, and the image-signal line 122 also serves as the source electrode (second source electrode) of the second transistor 142. The drain electrode (second drain electrode) 166 of the second transistor 142 is connected to the second electrode 172 of the capacitor 148 through a contact hole (a dotted circle in the drawing. The same is applied hereinafter), and the second electrode 172 forms a pair with the first electrode 170 of the capacitor 148.

The third transistor 144 has a semiconductor film 162, and a part of the second scanning line 126 (a portion protruding upward in the drawing) functions as a gate electrode. The semiconductor film 162 is electrically connected to the current-supplying line 124 and first source electrode 182 of the first transistor 140 in contact holes formed thereover.

The fourth transistor 146 has a semiconductor film 164, and a part of the third scanning line 128 (a portion protruding upward in the drawing) functions as a gate electrode. The semiconductor film 164 is electrically connected to the reset power-source line 130 and to the pixel electrode through a connection electrode 190 in contact holes formed thereover. The first drain electrode 184 and the connection electrode 190 are integrally formed as a single unit.

The first transistor 140 overlaps with the capacitor 148. Specifically, as shown in FIG. 4, the first transistor 140 includes a semiconductor film 180, and the semiconductor film 180 overlaps with the first electrode 170 and the second electrode 172. An area of the semiconductor film 180 can be smaller than that of the second electrode 172, and the whole of the semiconductor film 180 may overlap with the second electrode 172. The source electrode (first source electrode) 182 and the drain electrode (first drain electrode) 184 are disposed over the semiconductor film 180. Therefore, in the first transistor 140, current flows in a direction parallel to a direction in which the first scanning line 120, the second scanning line 126, and the third scanning line 128 extend. The drain electrode (first drain electrode) 184 is electrically connected to the first electrode 170 of the capacitor 148 and to the pixel electrode through the connection electrode 190.

Figure 5:
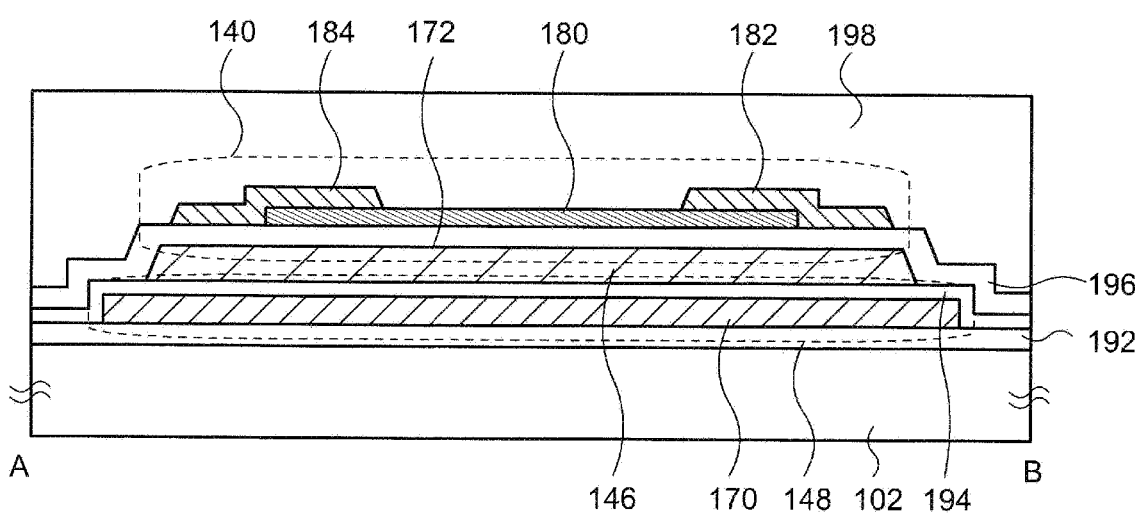
FIG. 5 is a schematic cross-sectional view of a pixel of a display device of an embodiment of the present invention.

A schematic cross-sectional view of the first transistor 140 and the capacitor 148 overlapping with each other is shown in FIG. 5. FIG. 5 is a cross-sectional view along a chain line C-D in FIG. 4. As shown in FIG. 5, the capacitor 148 is formed over the substrate 102 with an undercoat 192 interposed therebetween. The capacitor 148 includes the first electrode 170, the second electrode 172, and a first insulating film 194 sandwiched therebetween. The first insulating film 194 functions as a dielectric film of the capacitor 148.

The first transistor 140 is positioned over and overlaps with the capacitor 148. The first transistor 140 includes the second electrode 172 as a gate electrode and possesses a second insulating film 196 thereover and the semiconductor film 180 over the second insulating film 196. The second insulating film 196 serves as a gate insulating film in the first transistor 140. Furthermore, the first transistor 140 has, over the semiconductor film 180, the first source electrode 182 and the first drain electrode 184 which are electrically connected to the semiconductor film 180.

As described above, the second electrode 172 functions as one of the electrodes of the capacitor 148 and simultaneously serves as a gate electrode of the first transistor 140. In other words, the second electrode 172 is shared by the capacitor 148 and the first transistor 140.

A leveling film 198 is provided over the first transistor 140 and absorbs projections, depressions, and inclines caused by the capacitor 148 and the first transistor 140 to give a flat top surface.

There is no limitation to an element included in the semiconductor films 180, 160, 162, and 164 of the first transistor 140, the second transistor 142, the third transistor 144, and the fourth transistor 146, and silicon, germanium, or an oxide semiconductor is represented. Crystallinity of the semiconductor films 180, 160, 162, and 164 is also not limited and may be single crystalline, polycrystalline, microcrystalline, or amorphous.

In the present embodiment, the first transistor 140 is connected to the display element 150 in series. It is preferred that variation in electrical characteristics of the first transistor 140, such as a threshold voltage, be small to perform uniform display between the pixels 104. Additionally, a small off-leak current of the first transistor 140 is preferred. Therefore, as described below, the semiconductor film of the first transistor 140 is preferred to include an oxide semiconductor. In this case, the semiconductor films of the second transistor 142, the third transistor 144, and the fourth transistor 146 can contain silicon. Polarity of the second transistor 142, the third transistor 144, and the fourth transistor 146 may be a n-type or a p-type. When the semiconductor films 160, 162, and 164 of the second transistor 142, the third transistor 144, and the fourth transistor 146 include polycrystalline silicon (polysilicon), a high field-effect mobility can be obtained.

Structures of the second transistor 142, the third transistor 144, and the fourth transistor 146 are not particularly limited and may be a top-gate type or a bottom-gate type. In view of the manufacturing method of the display device 100 described below, a top-gate type is preferred. Moreover, with respect to the positional relationship between the semiconductor films, the source electrodes, and the drain electrodes, any of a bottom-contact type and a top-contact type may be adopted. In the second transistor 142, the third transistor 144, and the fourth transistor 146, the source electrode and the drain electrode may overlap with the gate electrode and, alternatively, may not overlap with the gate electrode. The number of the gate electrodes is also not necessarily single, and the second transistor 142, the third transistor 144, and the fourth transistor 146 may have a multi-gate structure having two or more gate electrodes.

As described above, variation in electrical characteristics (threshold voltage) of the first transistor 140 causes variation in luminance between the pixels 104, leading to a reduction in display quality. This tendency is significantly large particularly in the case where the semiconductor film 180 includes a polycrystalline silicon (polysilicon) semiconductor. In contrast, variation in characteristics and an off-leak current of a transistor including an oxide semiconductor are relatively small compared with those including a polysilicon semiconductor. Hence, the use of an oxide semiconductor in the semiconductor film 180 allows the realization of high-quality display.

On the other hand, when the semiconductor film 180 of the first transistor 140 includes an oxide semiconductor film, a large current cannot flow in the first transistor 140 compared with the case where the semiconductor film 180 is a silicon semiconductor film due to its small field-effect mobility. Accordingly, it is difficult to flow a large current in the display element 150 and obtain emission at a high luminance. However, as described above, the first transistor 140 is located over and overlaps with the capacitor 148 in the semiconductor device of the present embodiment. The use of such a structure allows an area occupied by the first transistor 140 to be reduced and a channel width to be significantly increased. Hence, it is possible to flow a large current in the display element 150 and provide an image at a high luminance even in the case where the semiconductor film 180 contains an oxide semiconductor.

Furthermore, as described below, the first insulating film 194 which is the dielectric film of the capacitor 148 functions as gate insulating films of the second transistor 142, the third transistor 144, and the fourth transistor 146 (see, FIG. 7C). A gate insulating film of a transistor is usually as extremely thin as 50 nm to 100 nm. Thus, it is possible to increase a capacitance of the capacitor 148. As a result, the potential input to the gate electrode of the transistor 140 and the second electrode 172 of the capacitor 148 can be maintained for a long time. Accordingly, the image signal Vsig can be held for a long time, and a writing frequency of the image signal Vsig can be decreased, which allows reduction in power consumption.

Second Embodiment

In the present embodiment, a manufacturing method of the display device 100 described in the First Embodiment is explained by using FIG. 6A to FIG. 10. Here, an explanation is made by illustratively showing the case where a light-emitting element is used as the display element 150, the semiconductor film 180 contains an oxide semiconductor, and the semiconductor films 160, 162, and 164 include polysilicon. FIG. 6A to FIG. 10 are cross-sectional views along chain lines A-B, C-D, and E-F.

1. Capacitor

Figures 6A, 6B, 6C:
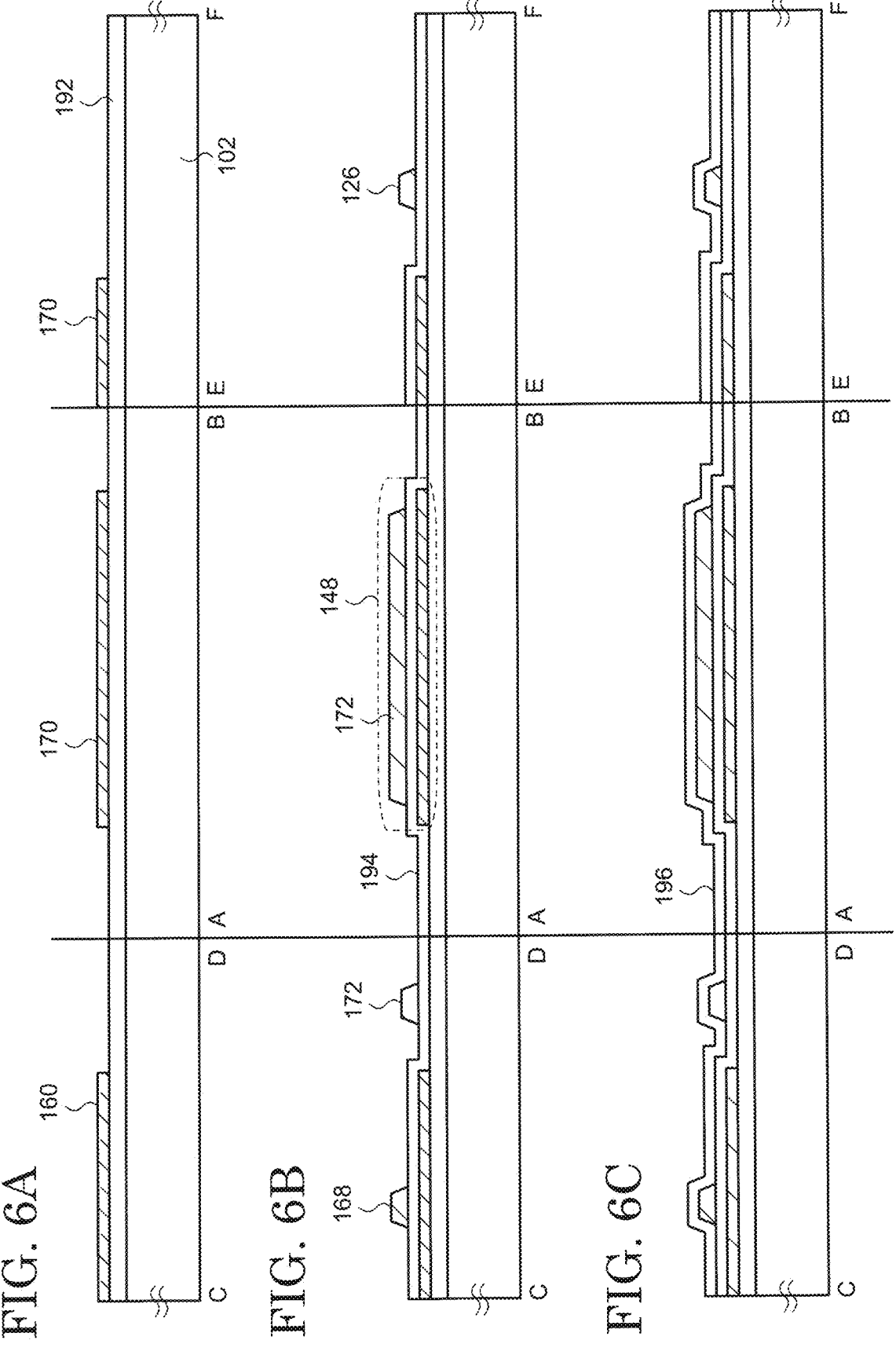
FIG. 6A to FIG. 6C are schematic cross-sectional views showing a manufacturing method of a display device of an embodiment of the present invention.

First, the undercoat 192 is formed over the substrate 102 (FIG. 6A). The substrate 102 has a function to support each semiconductor element shown in the First Embodiment. Therefore, a material having heat resistance to a process temperature of each semiconductor element formed thereover and chemical stability to chemicals used in the process may be used. Specifically, the substrate 102 may include glass, quartz, plastics, a metal, ceramics, and the like. When flexibility is provided to the display device 100, a polymer material can be used. For example, a polymer material exemplified by a polyimide, a polyamide, a polyester, and a polycarbonate can be employed. Note that, when a flexible display device 100 is fabricated, the substrate 102 may be called a base material or a base film.

The undercoat 192 is a film having a function to prevent impurities such as an alkaline metal from diffusing to each semiconductor element and the like from the substrate 102 and can include an inorganic insulator such as silicon nitride, silicon oxide, silicon nitride oxide, and silicon oxynitride. The undercoat 192 can be formed to have a single-layer or stacked-layer structure by applying a chemical vapor deposition method (CVD method), a sputtering method, a lamination method, and the like. When a CVD method is employed, a tetraalkoxysilane and the like may be used as a raw material gas. A thickness of the undercoat 192 can be freely selected from a range from 50 nm to 1000 nm and is not necessarily constant over the substrate 102. The undercoat 192 may have different thicknesses depending on position. For instance, when the undercoat 192 is configured with a plurality of layers, a silicon nitride-containing layer may be stacked over the substrate 102, and then a silicon oxide-containing layer may be stacked thereover.

When an impurity concentration in the substrate 102 is low, the undercoat 192 may not be provided or may be formed to cover a part of the substrate 102. For example, when a polyimide having a low concentration of an alkaline metal is employed as the substrate 202, the undercoat 192 may not be provided.

Next, the semiconductor film 160 and the first electrode 170 are formed over the undercoat 192. For example, amorphous silicon (a-Si) with a thickness of approximately 50 nm to 100 nm is formed over the undercoat 192 with a CVD method and is crystallized by performing a heating treatment or irradiation of light such as a laser to transform into a polysilicon film. The crystallization may be carried out in the presence of a catalyst such as nickel. After that, the polysilicon film is processed with etching to form the semiconductor film 160 and the first electrode 170. Although not shown, the semiconductor films 162 and 164 are formed simultaneously with the semiconductor film 160.

Next, the semiconductor film 160 is masked, and an ion-implantation treatment or an ion-doping treatment is conducted selectively on the first electrode 170. An element such as boron and aluminum imparting a p-type conductivity or an element such as phosphorus and nitrogen imparting an n-type conductivity is represented as an ion. With this process, a conductivity sufficient for the first electrode 170 to function as one of the electrodes of the capacitor 148 can be obtained.

Next, the first insulating film 194 is formed over the semiconductor film 160 and the first electrode 170 (FIG. 6B). The first insulating film 194 may have a single-layer structure or a stacked-layer structure and include an inorganic insulator usable in the undercoat 192. Similar to the undercoat 192, the first insulating film 194 can be formed by applying a sputtering method, a CVD method, or the like. The first insulating film 194 functions as the dielectric film of the capacitor 148 in addition to functioning as the gate insulating films of the second transistor 142, the third transistor 144, and the fourth transistor 146.

Next, a metal film is formed over the first insulating film 194 and subjected to processing with etching to give the gate electrode 168 of the second transistor 142 and the second electrode 172 of the capacitor 148 (FIG. 6B). Thus, these electrodes exist in the same layer. In this case, the wirings existing in the same layer as these electrodes, e.g., the second scanning line 126, the third scanning line 128, and the like, are simultaneously formed. It is preferred to adjust the areas of the first electrode 170 and the second electrode 172 so that the whole of a lower surface of the second electrode 172 overlaps with the first electrode 170 or the first electrode 170 is fully covered with the second electrode 172 in order to prevent variation in capacitance caused by misalignment.

The metal film can be formed by using a metal such as titanium, aluminum, copper, molybdenum, tungsten, and tantalum or an alloy thereof so as to have a single-layer or stacked layer structure. When the display device 100 of the present invention possesses a large area, the use of a metal with a high conductivity, such as aluminum and copper, is preferred in order to avoid signal delay. For example, a structure can be employed in which aluminum or copper is sandwiched by a metal having a relatively high melting-point, such as titanium and molybdenum.

Through the aforementioned processes, the capacitor 148 is fabricated.

2. Transistor

Next, the second insulating film 196 is formed so as to cover the gate electrode 168 and the second electrode 172 (FIG. 6C). The second insulating film 196 may have either a single-layer structure or a stacked-layer structure.

The second insulating film 196 serves as the gate insulating film of the first transistor 140. Therefore, it is preferred to use a silicon oxide-containing insulating film as the second insulating film 196 in order to suppress carrier generation in the semiconductor film 180 formed over the second insulating film 196. When the second insulating film 196 has a stacked structure, a region in contact with the semiconductor film 180 preferably contains silicon oxide.

The second insulating film 196 may be formed with the same method as that of the first insulating film 194 and include the same material as that of the first insulating film 194. When the second insulating film 196 is formed, it is preferred that an atmosphere contain as little hydrogen-containing gas such as hydrogen gas and water vapor as possible, by which the second insulating film 196 with a small hydrogen composition and an oxygen composition close to or larger than stoichiometry can be formed.

After forming the second insulating film 196, an ion-implantation treatment or an ion-doping treatment is performed on the semiconductor film 160 by using the gate electrode 168 as a mask. An element imparting a p-type conductivity, such as boron and aluminum, or an element imparting an n-type conductivity, such as phosphorus and nitrogen, is represented as an ion. This process allows the formation of a channel region in a region overlapping with the gate electrode 168 and a source/drain region in another region of the semiconductor film 160. Note that an ion-implantation treatment or an ion-doping treatment may be carried out on the third transistor 144 and the fourth transistor 146 as appropriate.

Figures 7A, 7B, 7C:
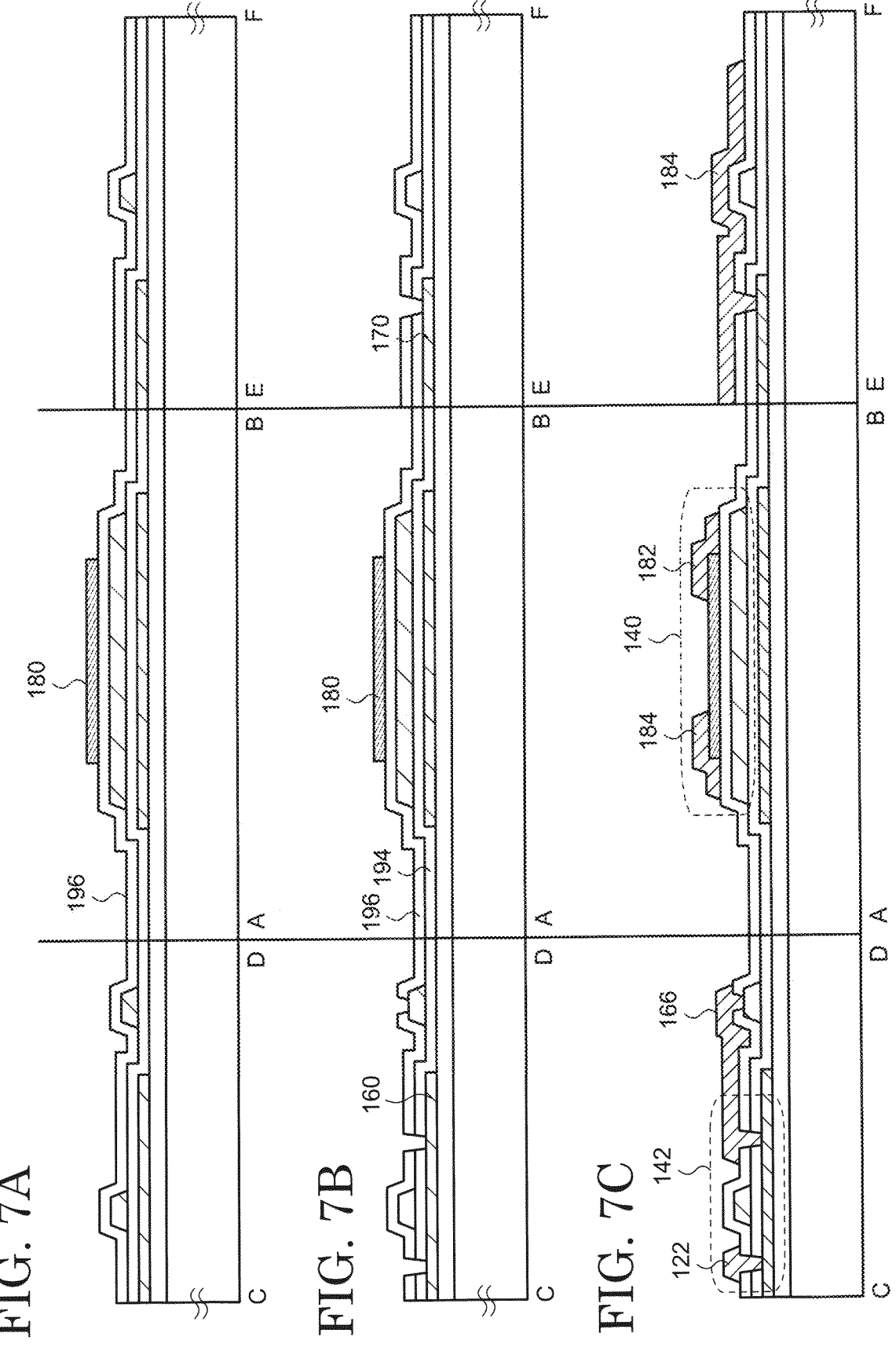
FIG. 7A to FIG. 7C are schematic cross-sectional views showing a manufacturing method of a display device of an embodiment of the present invention.

Next, the semiconductor film 180 is formed over the second insulating film 196 so as to overlap with the second electrode 172 (FIG. 7A). The semiconductor film 180 may include an oxide semiconductor which can be selected from Group 13 elements such as indium and gallium. The semiconductor film 180 may include a plurality of different Group 13 elements and may be IGO. The semiconductor film 180 may further contain Group 12 elements and is exemplified by IGZO. The semiconductor film 180 may include another element such as tin of Group 14 elements and titanium and zirconium of Group 4 elements.

The semiconductor film 180 is formed by utilizing a sputtering method and the like at a thickness of 20 nm to 80 nm or 30 nm to 50 nm. When a sputtering method is applied, the film formation can be conducted under an atmosphere containing oxygen gas, such as a mixed atmosphere of argon and oxygen gas. In this case, a partial pressure of argon may be lower than that of oxygen gas.

The semiconductor film 180 preferably possesses few crystal defects such as an oxygen defect. Hence, it is preferred to perform a heat treatment (annealing) on the semiconductor film 180. The heat treatment may be conducted before patterning or after patterning the semiconductor film 180. It is preferred that the heat treatment be performed before patterning because the oxide semiconductor film 180 may decrease in volume (shrinking) by the heat treatment. The heat treatment may be conducted in the presence of nitrogen, dry air, or atmospheric air at a normal pressure or a reduced pressure. The heating temperature can be selected from a range of 250° C. to 500° C. or 350° C. to 450° C., and the heating time can be selected from a range of 15 minutes to 1 hour. However, the heat treatment can be conducted outside these temperature and time ranges. Oxygen is introduced or migrated to the oxygen defects of the semiconductor film 180 by the heat treatment, which results in the semiconductor film 180 having a well-defined structure, a small number of crystal defects, and high crystallinity. Accordingly, the first transistor 140 having high reliability and excellent electrical properties such as a low off current and low property (threshold voltage) variation.

Next, as shown in FIG. 7B, the first insulating film 194 and the second insulating film 196 are processed with etching to form opening portions exposing the semiconductor film 160 and the first electrode 170. After that, the image-signal line 122, the second drain electrode 166, the first source electrode 182, and the first drain electrode 184 are formed to fill the opening portions (FIG. 7C). These wirings and electrodes can be formed by applying a similar material, structure, and method to those for the formation of the gate electrode 168 and the first electrode 170 and the second electrode 172 of the capacitor 148 and can exist in the same layer as one another. The image-signal line 122 also functions as the source electrode (second source electrode) of the second transistor 142. Note that a thickness of the semiconductor film 180 in the channel region may be smaller than that in a region covered by the first source electrode 182 or the first drain electrode 184. Although not shown, an insulting film for protecting the channel may be provided between the semiconductor film 180 and the first source electrode 182 and the first drain electrode 184.

With the above processes, the first transistor 140 and the second transistor 142 are fabricated as well as the third transistor 144 and the fourth transistor 146.

3. Display Element

Figures 8A, 8B:
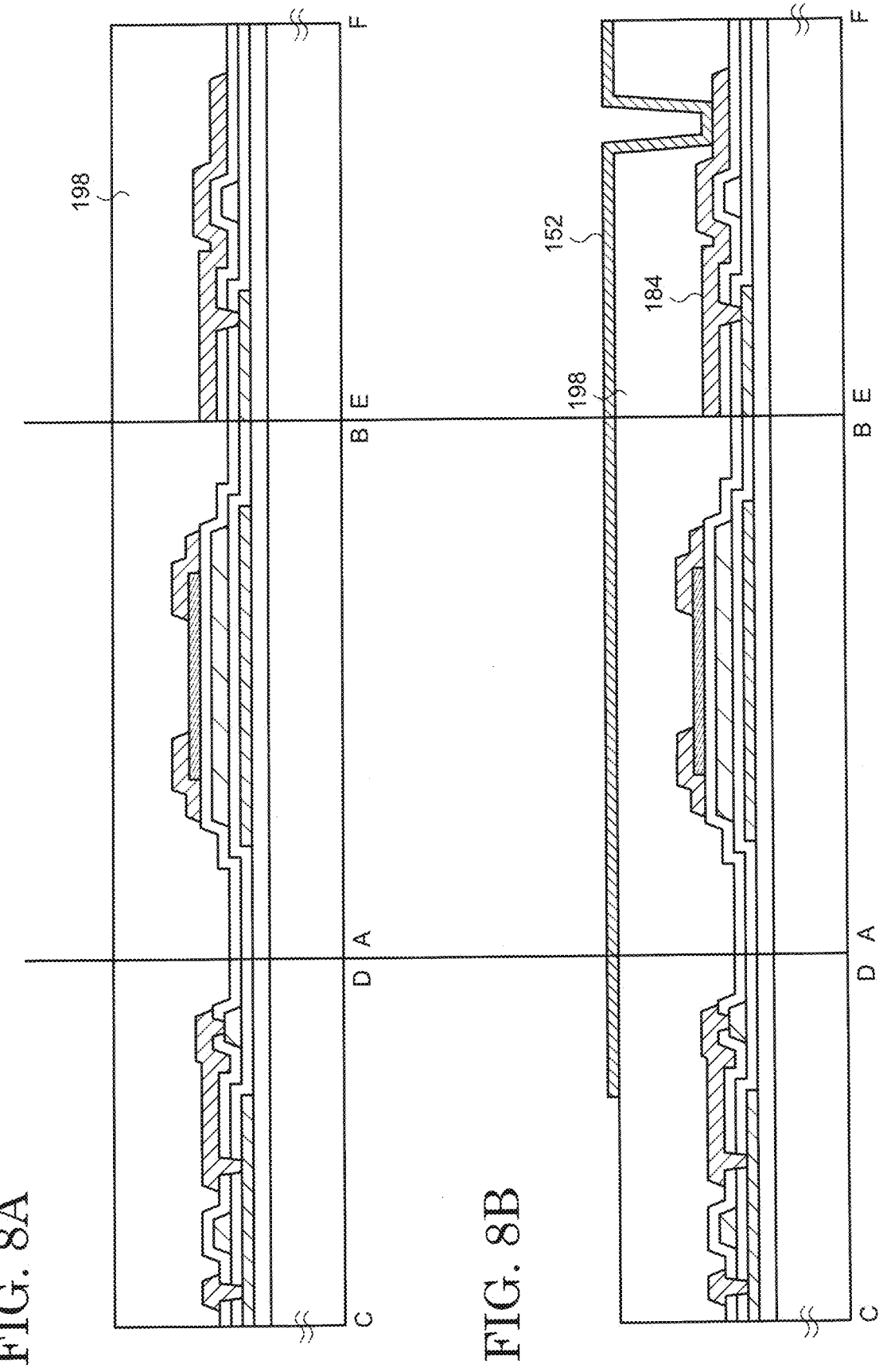
FIG. 8A and FIG. 8B are schematic cross-sectional views showing a manufacturing method of a display device of an embodiment of the present invention.

Next, the leveling film 198 is formed so as to cover the first transistor 140 and the second transistor 142 (FIG. 8A). The leveling film 198 can be formed by using an organic insulator. A polymer material such as an epoxy resin, an acrylic resin, a polyimide, a polyamide, a polyester, a polycarbonate, and a polysiloxane is represented as an organic insulator, and the leveling film 198 can be formed with a wet-type film-forming method such as a spin-coating method, an ink-jet method, a printing method, and a dip-coating method. The leveling film 198 may have a stacked structure including a layer containing the aforementioned organic insulator and a layer containing an inorganic insulator. In this case, a silicon-containing inorganic insulator such as silicon oxide, silicon nitride, silicon nitride oxide, and silicon oxynitride is represented as an inorganic insulator, and the layer containing an inorganic insulator can be formed with a sputtering method or a CVD method.

Next, the leveling film 198 is processed to form an opening portion exposing the first drain electrode 184 (FIG. 8B). After that, the pixel electrode 152 of the display element 150 is formed so as to cover the opening portion and be electrically connected to the first drain electrode 184.

When light emission from the display element 150 is extracted through the substrate 102, a material having a light-transmitting property, such as a conductive oxide exemplified by ITO and IZO, can be used for the pixel electrode 152. On the other hand, when the light emission from the display element 150 is extracted from a side opposite to the substrate 102, a metal such as aluminum and silver or an alloy thereof can be used. Alternatively, a stacked layer of the aforementioned metal or alloy and the conductive oxide can be employed. For example, a stacked structure in which a metal is sandwiched by a conductive oxide (e.g., ITO/silver/ITO etc.) can be used.

Figures 9A, 9B:
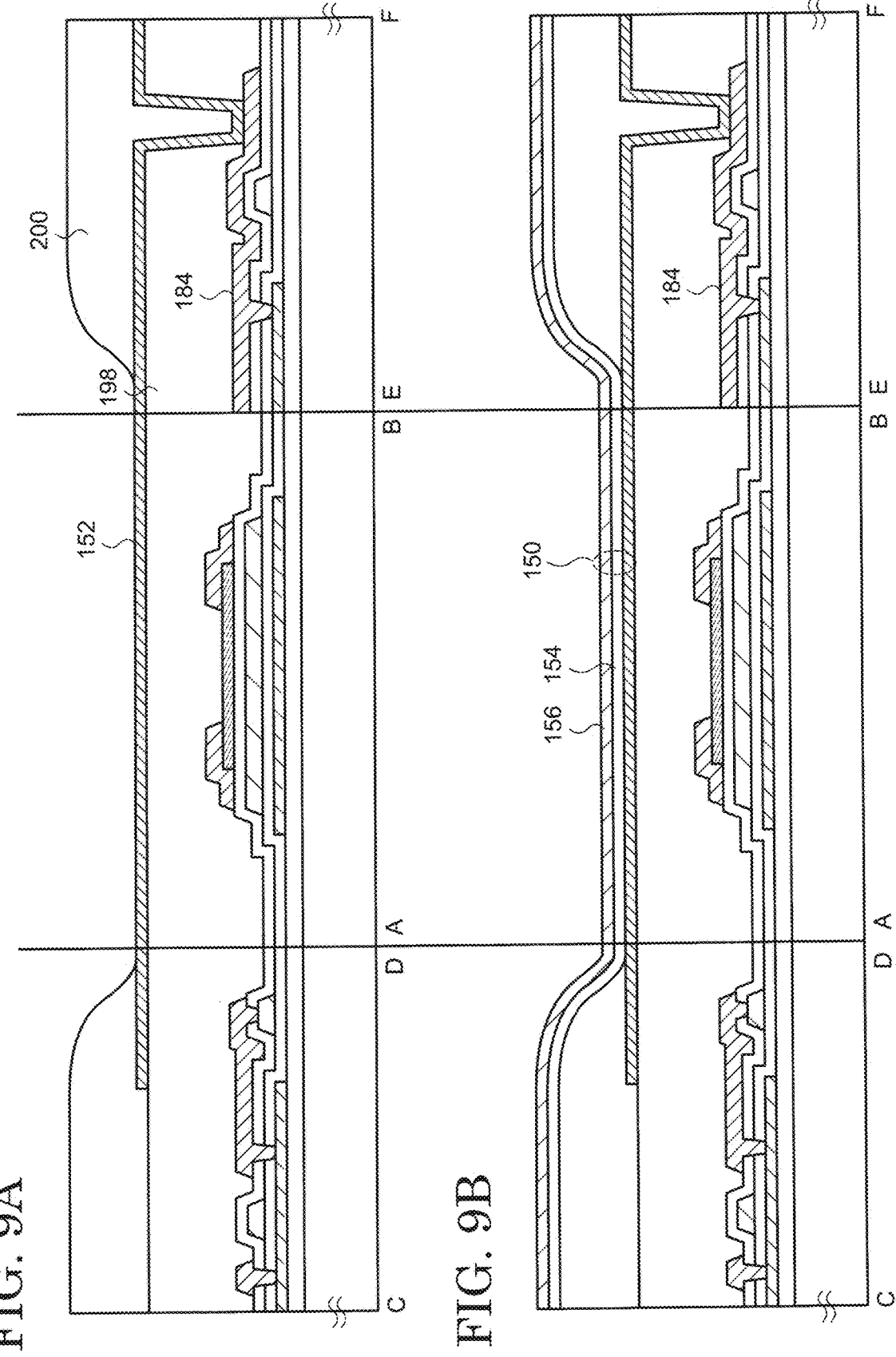
FIG. 9A and FIG. 9B are schematic cross-sectional views showing a manufacturing method of a display device of an embodiment of the present invention.

Next a partition wall 200 is formed (FIG. 9A). The partition wall 200 is formed so as to cover an edge portion of the pixel electrode 152 and the opening portion formed in the leveling film 198 and has a function to absorb steps caused by the edge portion and the opening portion and to electrically insulate the pixel electrodes 152 of the adjacent pixels 104 from each other. The partition wall 200 is also called a bank (rib). The partition wall 200 can be formed by using a material usable in the leveling film 198, such as an epoxy resin and an acrylic resin. The partition wall 200 has an opening portion so as to expose a part of the pixel electrode 152. An edge portion of the opening preferably has a moderately tapered shape because a steep slope in the edge portion of the opening portion may cause a defect in the EL layer 154 and the opposing electrode 156 formed later.

Next, the EL layer 154 is formed over the pixel electrode 152 (FIG. 9B). The EL layer 154 is formed so as to be in contact with the exposed portion of the pixel electrode 152 and cover at least a part of the partition wall 200. In the present specification and claims, an EL layer means all the layers sandwiched between a pair of electrodes and may be structured by a single layer or a plurality of layers. For example, the EL layer 154 can be structured by appropriately combining a carrier-injection layer, a carrier-transporting layer, an emission layer, a carrier-blocking layer, an exciton-blocking layer, and the like. Moreover, the EL layer 154 may be different in structure between adjacent pixels 104. For example, the EL layer 154 may be formed so that the emission layer is different but other layers are the same in structure between the adjacent pixels 104. With this structure, different emission colors can be obtained from the adjacent pixels 104, and full color display can be realized. On the contrary, the same EL layer 154 may be used in all pixels 104. In this case, the EL layer 154 giving white emission may be formed so as to be shared by all pixels 104, and the wavelength of the light extracted from each pixel 104 may be selected by using a color filter and the like. The EL layer 154 can be formed by applying an evaporation method or the aforementioned wet-type film-formation method.

Next, the opposing electrode 156 is formed over the EL layer 154 (FIG. 9B). The display element 150 is structured by the pixel electrode 152, the EL layer 154, and the opposing electrode 156. Carriers (electrons and holes) are injected to the EL layer 154 from the pixel electrode 152 and the opposing electrode 156, and the light-emission is obtained through a process in which an excited state generated by the recombination of the carriers relaxes to a ground state. Therefore, in the display element 150, a region in which the EL layer 154 and the pixel electrode 152 are in direct contact with each other is an emission region.

When the light emission from the display element 150 is extracted through the substrate 102, a metal such as aluminum and silver or an alloy thereof can be used for the opposing electrode 156. On the other hand, when the light-emission from the display element 150 is extracted through the opposing electrode 156, the opposing electrode 156 is formed by using the aforementioned metal or alloy so as to have a thickness which allows visible light to pass therethrough. Alternatively, a material having a light-transmitting property, such as a conductive oxide exemplified by ITO, IZO, and the like, can be used for the opposing electrode 156. Furthermore, a stacked structure of the aforementioned metal or alloy with the conductive oxide (e.g., MG-Ag/ITO, etc.) can be employed in the opposing electrode 156. The opposing electrode 156 can be formed with an evaporation method, a sputtering method, and the like.

With the above processes, the display element 150 is fabricated.

Figure 10:
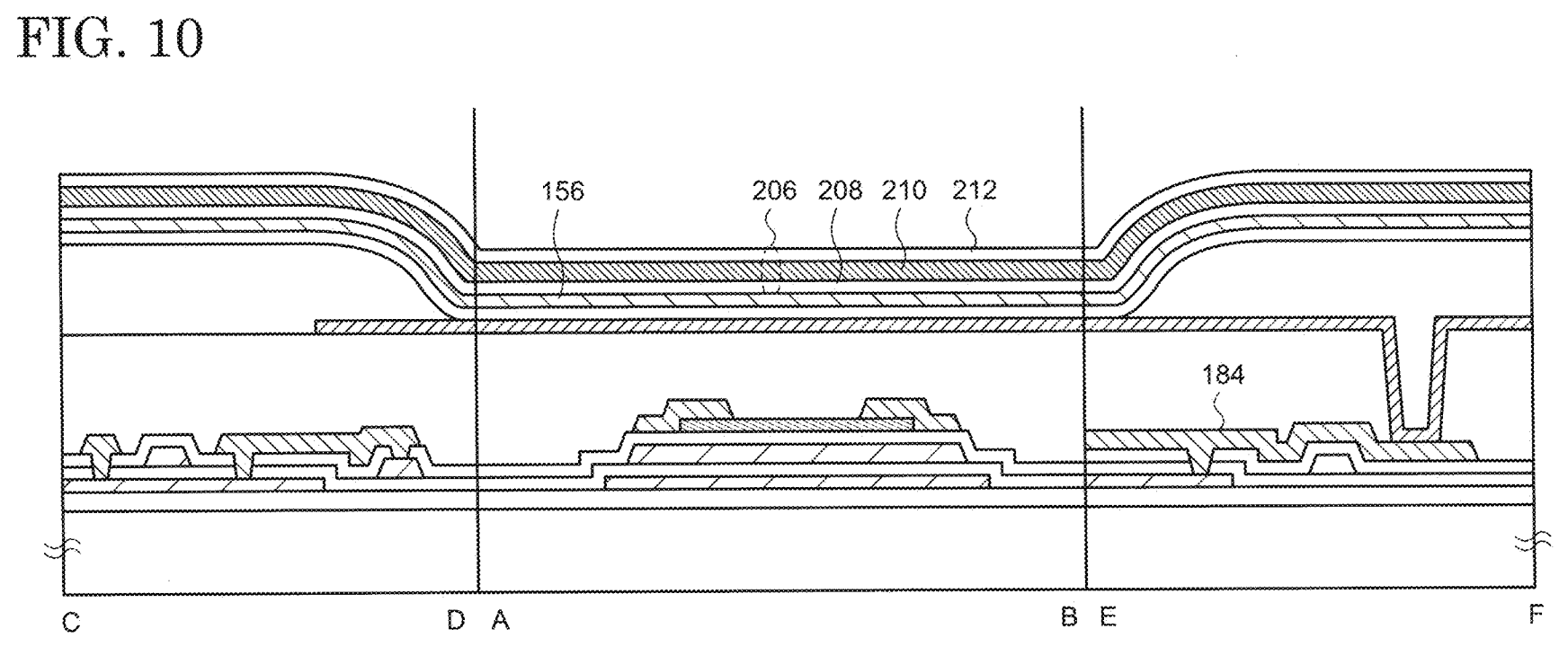

A passivation film (sealing film) 206 may be disposed over the opposing electrode 156 as an optional structure (FIG. 10). One of the functions of the passivation film 206 is to prevent water from entering the precedently prepared display element 150 from outside, and the passivation film 206 is preferred to have a high gas-barrier property. For example, it is preferred that the passivation film 206 be formed by using an inorganic material such as silicon nitride, silicon oxide, silicon nitride oxide, and silicon oxynitride. Alternatively, an organic resin including an acrylic resin, a polysiloxane, a polyimide, a polyester, and the like may be used. In the structure illustratively shown in FIG. 10, the passivation film 206 has a three-layer structure including a first layer 208, a second layer 210, and a third layer 212.

Specifically, the first layer 208 may include an inorganic insulator such as silicon oxide, silicon nitride, silicon nitride oxide, and silicon oxynitride and may be formed by applying a CVD method or a sputtering method. As a material for the second layer 210, a polymer material selected from an epoxy resin, an acrylic resin, a polyimide, a polyester, a polycarbonate, a polysiloxane, and the like can be used. The second layer 210 can be formed with the aforementioned wet film-forming method. Alternatively, the second layer 210 may be formed by atomizing or gasifying oligomers functioning as a raw material of the polymer material at a reduced pressure, spraying the first layer 208 with the oligomers, and polymerizing the oligomers. At this time, a polymerization initiator may be mixed in the oligomers. Additionally, the first layer 208 may be sprayed with the oligomers while cooling the substrate 102. The third layer 212 can be formed by applying the same material and method as those for the first layer 208.

Although not illustrated, the opposing substrate 116 may be arranged over the passivation film 206 as an optional structure (see, FIG. 1). The opposing substrate 116 is fixed to the substrate 102 with an adhesive. In this case, a space between the opposing substrate 116 and the passivation film 206 may be filled with an inert gas or a filler such as a resin. Alternatively, the passivation film 206 and the opposing substrate 116 may be directly adhered with an adhesive. When a filler is used, the filler is preferred to have a high transmitting property with respect to visible light. When the opposing substrate 116 is fixed to the substrate 102, a gap therebetween may be adjusted by adding a spacer in the adhesive or the filler. Alternatively, a structure functioning as a spacer may be formed between the pixels 104.

Furthermore, a light-shielding film having an opening in a region overlapping with the emission region and a color filter in a region overlapping with the emission region may be disposed over the opposing substrate 116. The light-shielding film is formed by using a metal with a relatively low reflectance, such as chromium and molybdenum, or a mixture of a resin material with a coloring material having a black or similar color. The light-shielding film has a function to shield the scattered or reflected external light and the like other than the light directly obtained from the emission region. The color filter can be formed while changing its optical properties between the adjacent pixels 104 so that red emission, green emission, and blue emission are extracted. The light-shielding film and the color filter may be provided over the opposing substrate 116 with an undercoat film interposed therebetween, and an overcoat layer may be further arranged to cover the light-shielding film and the color filter.

Through the above processes, the display device 100 described in the First Embodiment is manufactured.

Third Embodiment

Figure 11:
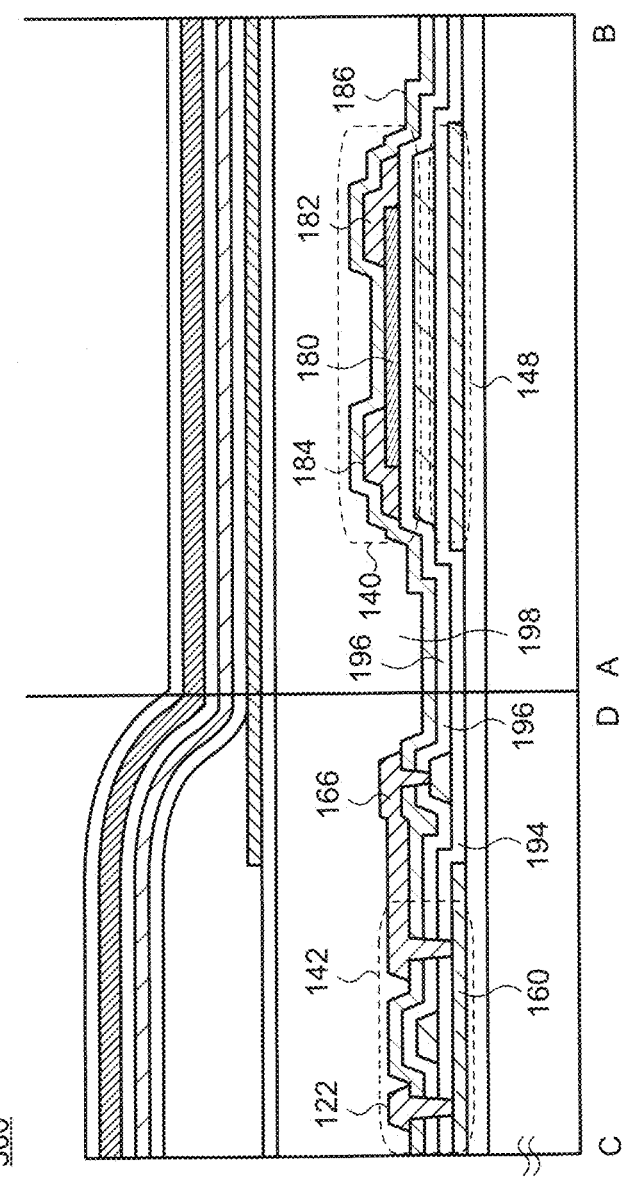
FIG. 11 is a schematic cross-sectional view of a display device of an embodiment of the present invention.
Figure 12:
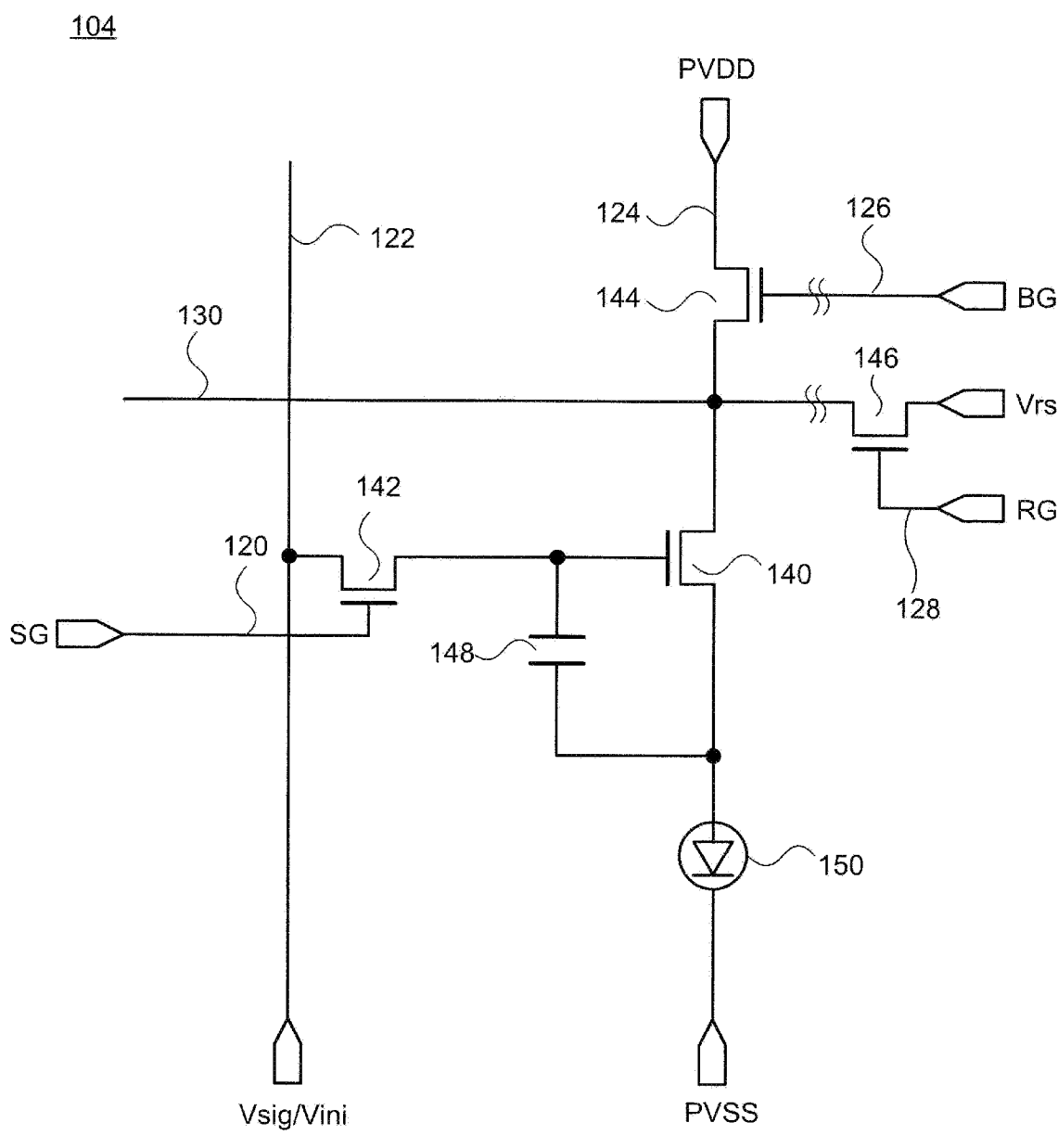
FIG. 12 is an equivalent circuit of a pixel of a display device of an embodiment of the present invention.

In the present embodiment, a display device 300 according to an embodiment of the present invention is explained by using FIG. 11. Explanation of the contents duplicated in the First and Second Embodiments may be omitted.

A schematic cross-sectional view of the display device 300 is shown in FIG. 11. FIG. 11 corresponds to the cross-sections along chain lines A-B and C-D in FIG. 4. A difference from display device 100 is that the display device 300 possesses, over the first transistor 140, the first source electrode 182, the first drain electrode 184, and a third insulating film 186 in contact with the semiconductor film 180. The third insulating film 186 extends to the second transistor 142 and to the third transistor 144 and the fourth transistor 146 which are not illustrated and is sandwiched between the image-signal line 122 serving as the second source electrode and the second insulating film 196 and between the second drain electrode 166 and the second insulating film 196.

The third insulating film 186 may contain the same material as that of the second insulating film 196 and can be formed by applying the same formation method as that for the second insulating film 196. Similar to the second insulating film 196, it is also preferred that the third insulating film 186 contain silicon oxide in order to suppress carrier generation in the semiconductor film 180.

In the present embodiment, the first source electrode 182 and the first drain electrode 184 are formed over the semiconductor film 180, and then the third insulating film 186 is formed before forming the second source electrode (image-signal line 122) and the second drain electrode 166. Sequentially, the first insulating film 194, the second insulating film 196, and the third insulating film 186 are simultaneously subjected to etching processing to form opening portions exposing the semiconductor film 160, and the second source electrode (image-signal line 122) and the second drain electrode 166 are formed in the opening portions.

The use of such a structure enables prevention of loss and contamination of the semiconductor film 180 when the opening portions are formed in the first insulating film 194, the second insulating film 196, and the third insulating film 186. Furthermore, in the case where an oxide film, which is formed on a surface of the semiconductor film 160 after being exposed, is removed with a strong acid such as hydrofluoric acid, the semiconductor film 180 is prevented from being lost or contaminated.

Similar to the display device 100, the display device 300 possesses the first transistor 140 which is stacked over the capacitor 148 and has the semiconductor film 180 containing an oxide semiconductor. Therefore, high-quality images can be realized because of the small variation in characteristics of a transistor having an oxide semiconductor. Additionally, the stack of the capacitor 148 with the first transistor 140 results in a large channel width, which allows a large current to flow in the display element 150, providing an image at a high luminance. Furthermore, the capacitor 148 having a large capacitance can be fabricated, by which a writing frequency of the image signal Vsig can be reduced. Accordingly, power consumption can be decreased.

Fourth Embodiment

In the present embodiment, a display device 400 according to an embodiment of the present invention is explained by using FIG. 1, FIG. 2, FIG. 12, and FIG. 13. Explanation of the contents duplicated in the First to Third Embodiments may be omitted.

Similar to the display device 100, the display device 400 also has a plurality of pixels 104 (FIG. 1 and FIG. 2). However, as demonstrated by an equivalent circuit of FIG. 12, the pixel 104 of the display device 400 is different from that of the display device 100 in that the drain electrode of the fourth transistor 146 used to initialize the first transistor 140 is connected to the drain electrode of the third transistor 144 and the source electrode of the first transistor 140. Hence, it is not necessary to provide the fourth transistor 146 in each pixel 104, and the fourth transistor 146 can be disposed in the driver circuits 108. Accordingly, it is possible to decrease the size of each pixel 104 and improve an aperture ratio thereof.

Figure 13:
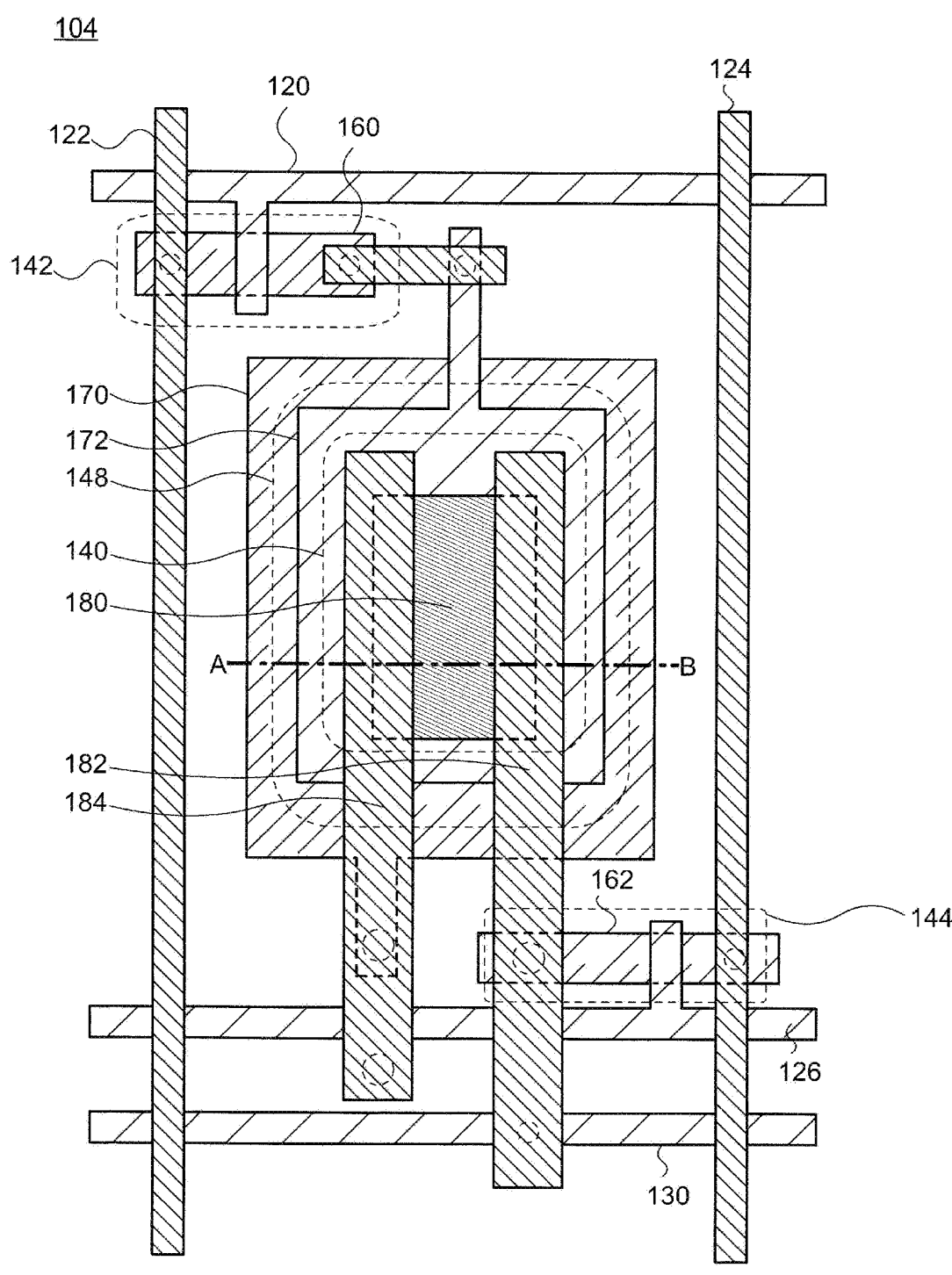
FIG. 13 is a schematic top view of a pixel of a display device of an embodiment of the present invention.

As shown in FIG. 13, the reset power-source line 130 extends substantially parallel to the first scanning line 120 and the second scanning line 126 in the display device 400 and is connected to the fourth transistor 146 disposed in the driver circuits 108 shown in FIG. 1. Hence, the reset power-source line 130 can exist in the same layer as the first scanning line 120 and the second scanning line 126. The reset power-source line 130 is connected to the first source electrode 182 of the first transistor 140 through a contact hole.

The first transistor 140 is arranged over the capacitor 148 of the display device 400 and is able to possess a large channel width similarly to the display device 100. Therefore, a large current can be flowed in the first transistor 140 even if an oxide semiconductor is used in the semiconductor film 180, thereby enabling the display element 150 to be driven at a high luminance. Additionally, the use of an oxide semiconductor in the semiconductor film 180 reduces variation in characteristics between the pixels 104. Hence, the present embodiment allows a high-quality image to be displayed at a high luminance.

Fifth Embodiment

In the present embodiment, a display device 500 according to an embodiment of the present invention is explained by using FIG. 1, FIG. 2, FIG. 14, and FIG. 15. Explanation of the contents duplicated in the First to Fourth Embodiments may be omitted.

Figure 14:
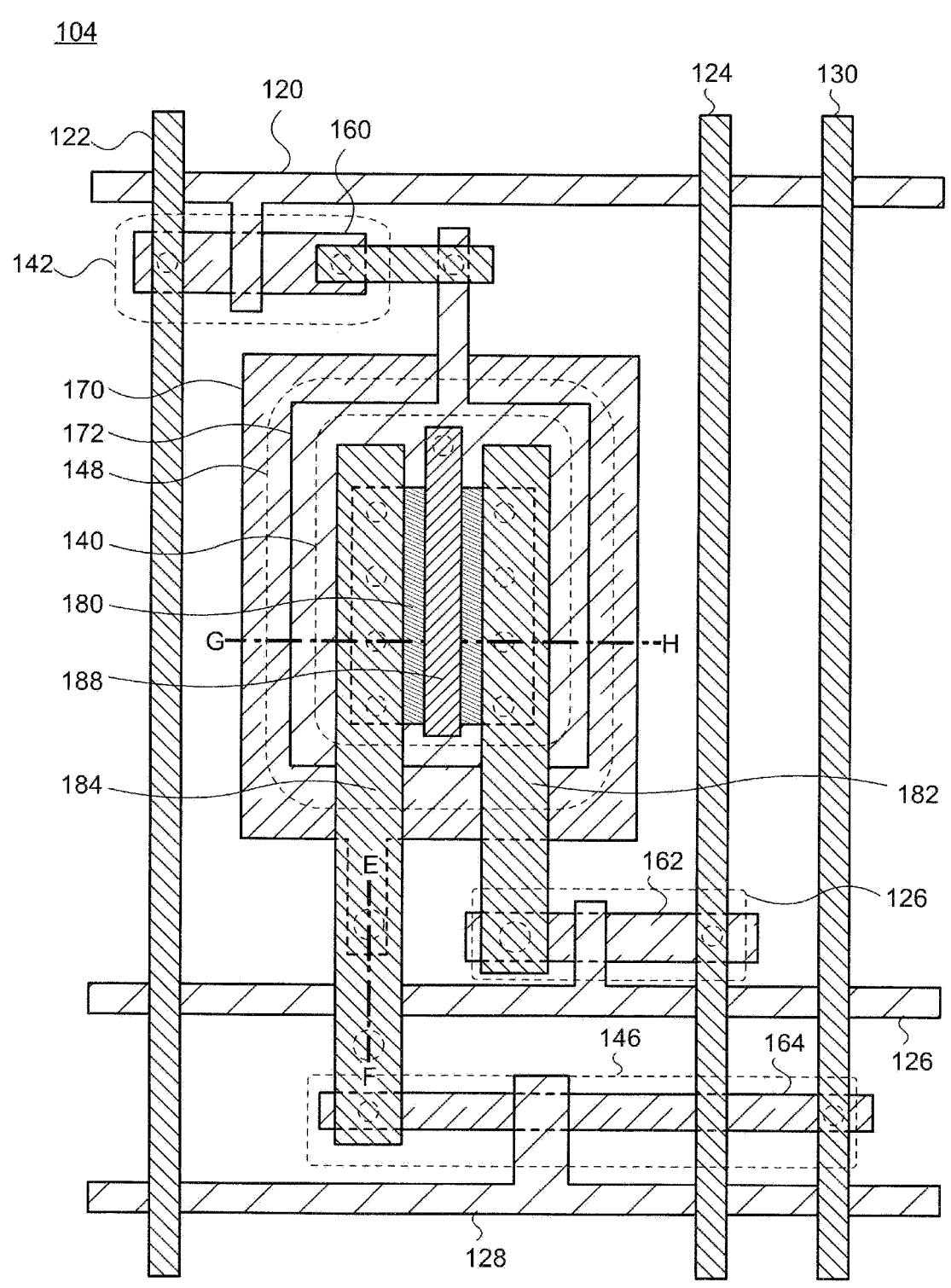
FIG. 14 is a schematic top view of a pixel of a display device of an embodiment of the present invention.

Similar to the display device 100, the display device 500 also has a plurality of pixels 104 (FIG. 1 and FIG. 2). As shown in FIG. 14, unlike the display device 100, the display device 500 further possesses a third electrode 188 overlapping with the semiconductor film 180. The third electrode 188 may be connected to the second electrode 172 through a contact hole. In this case, the same potential is applied to the second electrode 172 and the third electrode 188. Thus, the first transistor 140 has a structure having two gate electrodes over and under the semiconductor film 180.

Figure 15:
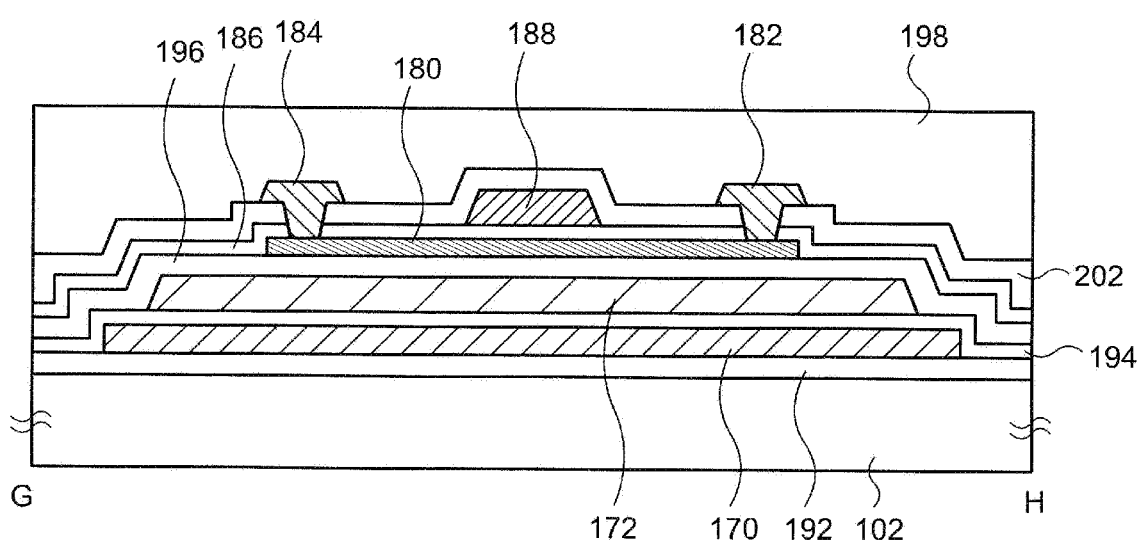
FIG. 15 is a schematic cross-sectional view of a pixel of a display device of an embodiment of the present invention.

FIG. 15 shows a schematic drawing of a cross-section along a chain line G-H of FIG. 14. The third insulating film 186 is provided over the semiconductor film 180, and the third electrode 188 functioning as a gate electrode is formed thereover. The display device 500 further possesses a fourth insulating film 202 over the third electrode 188, and the first source electrode 182 and the first drain electrode 184 are electrically connected to the semiconductor film 180 through contact holes formed in the third insulating film 186 and the fourth insulating film 202.

The third insulating film 186 and the fourth insulating film 202 can be formed in a similar structure with a similar method to those of the third insulating film 186 of the Third Embodiment, and the third electrode 188 can be formed in a similar structure with a similar method to those of the second electrode 172.

In the display device 500 of the present embodiment, since channels are formed in an upper portion and a lower portion of the semiconductor film 180, the channel width is expanded in appearance and a larger current can be flowed. As a result, a high-quality image can be supplied at a high luminance. Additionally, provision of two gate electrodes allows the threshold shift to be controlled more effectively, enabling the production of a highly reliable display device.

Sixth Embodiment

In the present embodiment, a display device 600 according to an embodiment of the present invention is explained by using FIG. 1 to FIG. 3, FIG. 16, and FIG. 17. Explanation of the contents duplicated in the First to Fifth Embodiments may be omitted.

Similar to the display device 100, the display device 600 also has a plurality of pixels 104 (FIG. 1 and FIG. 2), and the equivalent circuit of the pixel 104 is also the same as that shown in FIG. 3. Differences from the First Embodiment are that, as shown in FIG. 16, the first scanning line 120 is located between the second scanning line 126 and the third scanning line 128 and that a direction of a current flowing in the first transistor 140 is perpendicular to a direction in which the first scanning line 120, the second scanning line 126, and the third scanning liner 128 extend.

Figure 16:
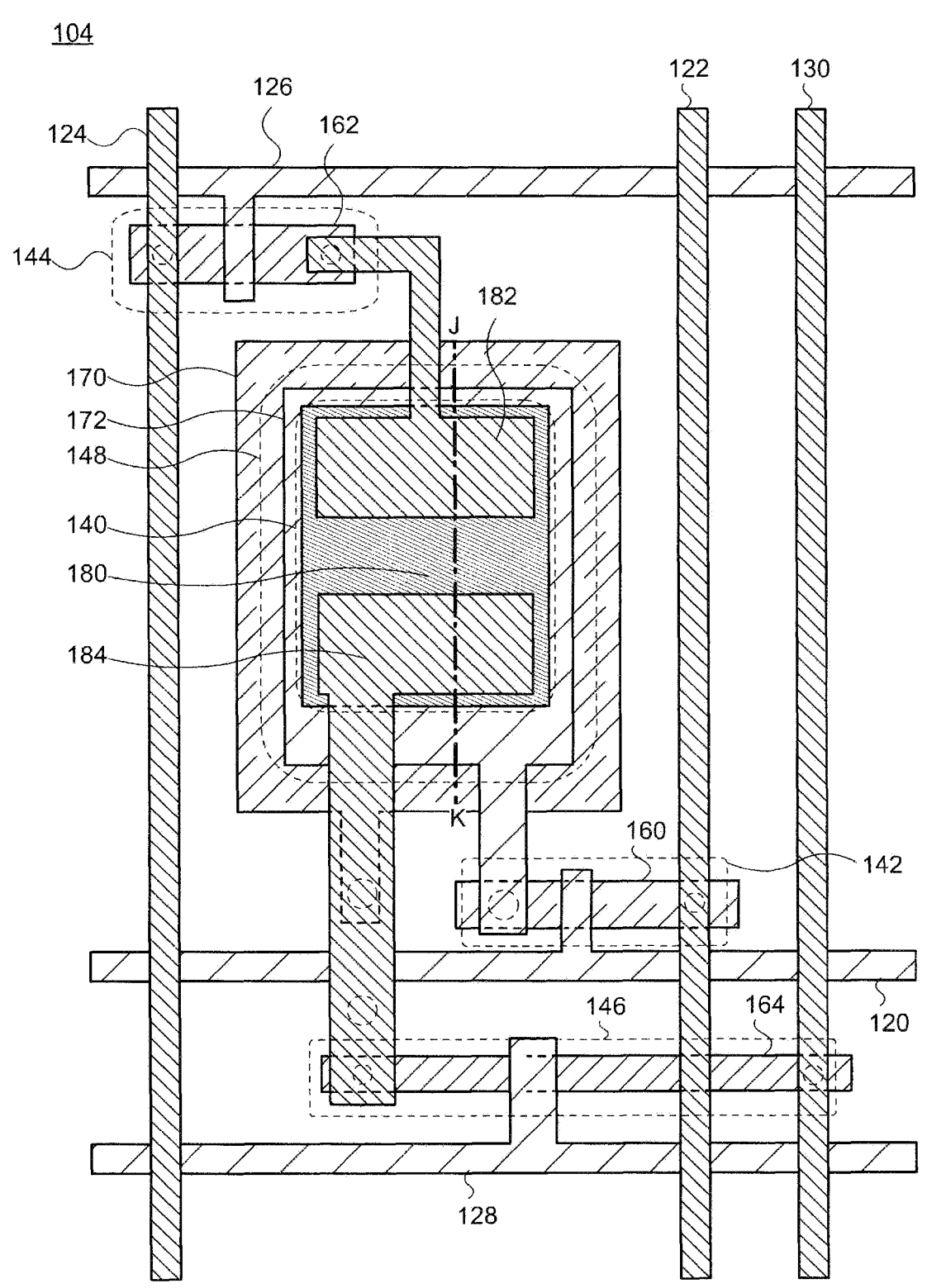
FIG. 16 is a schematic top view of a pixel of a display device of an embodiment of the present invention.
Figure 17:
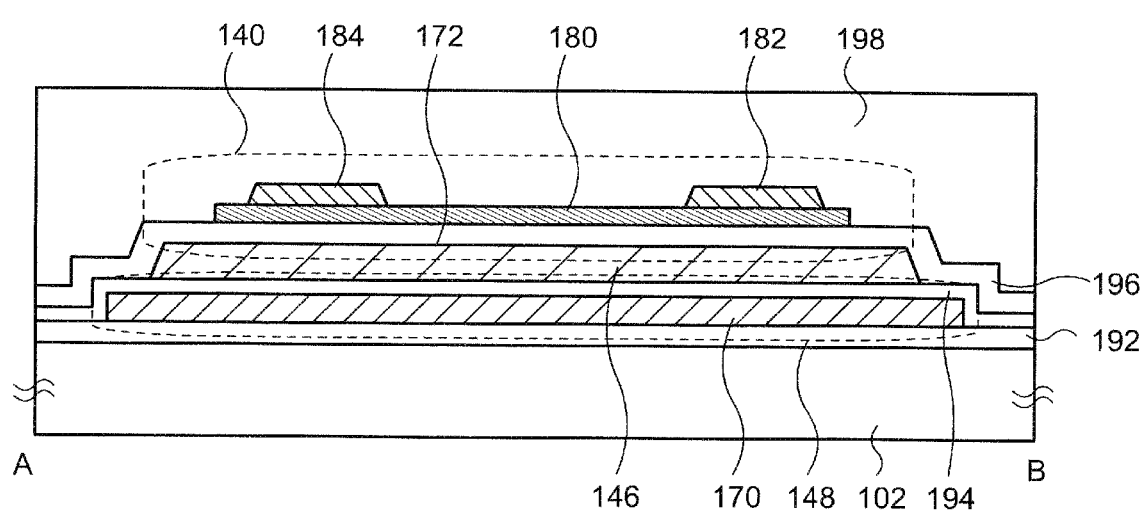
FIG. 17 is a schematic cross-sectional view of a pixel of a display device of an embodiment of the present invention.

A schematic drawing of a cross-section along a chain line J-K of FIG. 16 is shown in FIG. 17. In the display device 600, the first transistor 140 is placed over the capacitor 148, and the second electrode 172 is shared by the capacitor 148 and the first transistor 140. The first electrode 170 and the second electrode 172 of the capacitor 148 and the semiconductor film 180 overlap with one another.

In the display device 600, similar to the display device 100, the capacitor 148 and the first transistor 140 are stacked together. The use of an oxide semiconductor in the semiconductor film 180 of the first transistor 140 allows a high-quality image to be realized due to the small variation in characteristics of a transistor having an oxide semiconductor. Additionally, the stack of the capacitor 148 with the first transistor 140 results in a large channel width, which enables a large current to flow in the first transistor 140 even if an oxide semiconductor is employed in the semiconductor film 180. As a result, it is possible to flow a large current in the display element 150, enabling an image to be provided at a high luminance. Furthermore, the capacitor 148 having a large capacitance can be fabricated, by which a writing frequency of the image signal Vsig can be reduced. Accordingly, power consumption can be decreased.

The aforementioned modes described as the embodiments of the present invention can be implemented by appropriately combining with each other as long as no contradiction is caused. Furthermore, any mode which is realized by the persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A circuit substrate comprising:
a first transistor comprising:
a first gate electrode;
a first insulating film over the first gate electrode;
an oxide semiconductor film over the first insulating film; and a first metal and a second metal over the oxide semicon-
ductor film, the first metal and the second metal being
electrically connected to the oxide semiconductor film;

a second transistor comprising:

a semiconductor film including silicon;

a second insulating film over the semiconductor film and
under the first gate electrode;

a second gate electrode over the second insulating film;
and a third metal and a fourth metal electrically connected to
the semiconductor film; and an interlayer film located over the first metal and the
second metal, wherein the interlayer film is sandwiched between the
third metal and the second insulating film and between
the fourth metal and the second insulating film, and wherein a conductive layer is disposed under the second
insulating film and overlaps the first gate electrode in a
plane view.

2. The circuit substrate according to claim 1,
wherein a capacitor is formed by the conductive layer, the
first gate electrode, and the second insulating film.

3. The circuit substrate according to claim 1,
wherein the conductive layer includes silicon.

4. The circuit substrate according to claim 1,
wherein an area of the oxide semiconductor film is
smaller than an area of the first gate electrode.

* * * * *